United States Patent [19]

Usami

[11] Patent Number: 5,210,400

[45] Date of Patent: May 11, 1993

[54] SOLID-STATE IMAGING DEVICE APPLICABLE TO HIGH SENSITIVITY COLOR CAMERA AND USING DIFFRACTION GRATINGS

[75] Inventor: Toshiro Usami, Yokohama, Japan

[73] Assignee: Kabushiki Kaisha Toshiba, Kawasaki, Japan

[21] Appl. No.: 730,542

[22] Filed: Jul. 16, 1991

[30] Foreign Application Priority Data

Jul. 17, 1990 [JP] Japan .................. 2-188442

[51] Int. Cl.$^5$ ............................. H01J 40/14
[52] U.S. Cl. .................. 250/208.1; 250/216; 250/237 R
[58] Field of Search ............ 250/208.1, 226, 211 R, 250/216, 237 R; 356/326, 328; 359/566, 571, 572; 358/55, 75

[56] References Cited

U.S. PATENT DOCUMENTS

| | | | |
|---|---|---|---|
| 4,675,727 | 6/1987 | Sekizawa et al. | 358/75 |
| 4,841,140 | 6/1989 | Sullivan et al. | 250/226 |
| 4,898,467 | 2/1990 | Milch | 358/75 |
| 5,020,910 | 6/1991 | Dunn et al. | 359/572 |
| 5,037,201 | 8/1991 | Smith, III et al. | 250/576 |

Primary Examiner—David C. Nelms
Assistant Examiner—K. Shami
Attorney, Agent, or Firm—Foley & Lardner

[57] ABSTRACT

The solid-state imaging device is applicable to a high sensitivity color camera although its structure is as simple as that of a monochromatic camera, and comprises a semiconductor chip in which a large number of pixels are arranged in a matrix form on one surface of a semiconductor substrate, and an optical grating body for separating an incident light into rays of light to allow them to be incident to the pixel trains in one direction on the chip. The optical grating body includes optical gratings arranged at a pitch corresponding to two or three pixels of a pixel train in a direction perpendicular to the above-mentioned one direction, having a fixed inclination relative to the substrate surface, and juxtaposed provided in the above-mentioned one direction, and a supporting surface for supporting the gratings so that they have the above-mentioned fixed inclination.

9 Claims, 3 Drawing Sheets

SOLID-STATE IMAGING DEVICE APPLICABLE TO HIGH SENSITIVITY COLOR CAMERA AND USING DIFFRACTION GRATINGS

BACKGROUND OF THE INVENTION

This invention relates to a solid-state imaging device, and more particularly, to a solid-state imaging device used in a high sensitivity color camera.

In the case of constituting a color camera by using a solid-state imaging device or devices, the structure of the three imaging device type, the single imaging device or two imaging device type is employed. The configuration of a color camera of the three imaging device type is first shown in FIG. 1. A white light W incident to an imaging lens 1 and passed therethrough is separated into blue light B, red light R and green light G by a dichroic prism 2. These rays of light are incident to three solid-state imaging devices 3, 4 and 5 provided in respective light paths. Thus, a color image signal is provided.

In actual terms, only the blue light B of the white light W passed through the imaging lens 1 is reflected by a dichroic surface 6. After being reflected on a reflection mirror 7, the blue light B is incident to the solid-stage imaging device 3 for blue. The red light R of the rays of light which not reflected by the dichroic surface 6 is reflected by a dichroic surface 8. After reflected by a being reflection mirror 9, the red light R is incident to the solid-state imaging device 4 for red. The remaining green light G is not reflected by any one of dichroic surfaces, and is incident to the solid-state imaging device 5 for green. Then, photoelectric conversion is carried out at the solid-state imaging devices 3, 4 and 5. Thus, a color image signal is provided from three electric signals outputted therefrom.

This three imaging device type camera has a high sensitivity because the white light W is optically separated to use rays of light of all wavelength bands. Furthermore, it is possible to set the number of pixels corresponding to pixels of a monochromatic image for every color, resulting in excellent resolution and good picture quality. However, since three solid-stage imaging devices 3, 4 and 5 are used for one camera, not only the number of parts is increased, but also a dichroic prism which is in a complicated form and is expensive because of necessity of reflection surfaces corresponding to wavelength bands of respective colors is required. Furthermore, the precise positioning between the solid-state imaging devices 3, 4 and 5 and the optical system including the imaging lens 1 and the dichroic prism 2 is required. As a result the camera becomes large and expensive because of the space required for positioning. For this reason, cameras of this system only have a limited use such as use for broadcasting, or business use, etc.

The configuration of a color camera 10 of the single imaging device is shown in FIG. 2. A white light W passed through an imaging lens 11 is passed through a color filter 12, and is then incident to a single monochromatic solid-state imaging-device 13. The color filter 12 is such that respective portions of red R, green G and blue B are, arranged in a mosaic form as shown in FIG. 3. For one color filter 12 of this kind, there is a color in which a filter element printed on a glass base plate is tightly fixed on the chip for a monochromatic device, and there is a color filter in which such a filter element is formed on a chip for a monochromatic device directly by patterning.

A signal outputted from the solid-state imaging device 13 is inputted to a color separation circuit 15, at which it is separated into signals G, R and B of the three primary colors. The green signal G of these signals is provided by interchangeably sampling a signal delayed by an 1H delay circuit 14 and an original signal per each pixel and adding them. Respective color signals go through low-pass filters 16a, 16b and 16c, process amplifiers 17a, 17b and 17c, and a high-frequency component separation circuit 18. Thus, a color image signal V corresponding to three color light is synthesized by a color encoder 19.

Meanwhile, there are many instances where the color filter is contained in the package such that it is it is included in a semiconductor chip. For this reason, the optical system can be constructed in the same manner as in the monochromatic imaging device Thus, the camera can be miniaturized and reduced in cost. However, rays of light except for respective specific wavelengths must be absorbed for every color component by such a color filter 12. As a result, only one third of the entire quantity of an incident light reaches the pixel unit of the solid-state imaging device 13. For this reason, lowering of the sensitivity cannot be avoided when compared with the camera of the three solid-stage imaging device. In addition, the number of pixels corresponding to respective wavelength bands is reduced to one third of that of the monochromatic imaging device, and the spatial resolution is also lowered.

The camera of the two solid-state imaging device type is constructed to synthesize signals from two solid-state imaging devices to provide a signal corresponding to three wavelength bands. This camera is adapted to compensate for the drawbacks of the camera of the three solid-state imaging device type as well as the camera of the single solid-state imaging device type. However, the camera of the two solid-state imaging device type has an intermediate property in the dimension, cost, sensitivity, and resolution. Therefore, the camera of this type cannot essentially solve the problems with the camera of the three solid-state imaging device type and the camera of the single solid-state imaging device type.

As described above, even in the case where any system of color cameras using conventional solid-state imaging device is selected, the camera employed could not satisfy the requirements of dimension and sensitivity, etc.

SUMMARY OF THE INVENTION

With the above in view, an object of this invention is to provide a solid-state imaging device for a color camera capable of constituting a high sensitivity color camera with an optical system similar to that in a monochromatic solid-state imaging device by using a single solid-state imaging device.

A solid-state imaging device according to this invention comprises a semiconductor chip on which a plurality of pixel trains are provided, and an optical grating body including optical gratings provided in parallel to the respective pixel trains at a pitch two times or three times larger than the pixel train, to separate, every optical grating, an incident light into rays of light having different wavelength distributions to allow them to be incident to the pixel trains.

Here, there may be employed an arrangement such that the optical grating body is provided with an air layer existing between the optical grating body and the semiconductor chip, and that a lens body for converging a light every pixel train to allow it to be incident thereto is provided on the surface of the semiconductor chip.

Furthermore, the optical grating body may be bonded on the wiring portion of the semiconductor chip by metal in the form of a bump.

The optical grating body may formed in the optical window section.

The semiconductor chip and the optical grating body may be molded by potting resin with an air layer existing therebetween.

When a light is incident to the optical grating body, it is separated into rays of light having different wavelength distributions every optical grating. These ray of light thus separated are incident every 2 or 3 pixels, respectively. In the case of absorbing an incident light by using a color filter to carry out separation into spectral components as in the conventional camera of the single imaging device type, only one third of the light quantity of an incident light reaches the pixel train. In contrast, in accordance with this invention, since separation of light into spectral components is carried out by the optical grating like a prism to use rays of light of the entire wavelength bands, high sensitivity is provided. Further, since separation of light into spectral components is made by the optical grating body without using a dichroic prism which is expensive and large in dimension, a miniaturized and low cost camera is provided.

Here, in the case where the optical grating body is provided with an air layer existing between the optical grating body and the semiconductor chip, and a lens body is provided on the semiconductor chip surface, separation of light into rays of light having different wavelength distributions is carried out at the boundary between the optical grating body and the air layer, and these rays of light are converged by the lens body every pixel train. Thus, an increased light quantity can be obtained.

In the case where the optical grating body is connected to the wiring portion of the semiconductor chip by the metal in the form of a bump, high parallelism therebetween is provided. Thus, rays of light separated will precisely reach respective pixel trains to be incident thereupon.

Furthermore, in the case where the optical grating body and the optical window section of the package are separately provided, multiple reflections may take place to produce a flare component. On the contrary, in the case where the optical grating body is formed in the optical window section, such a flare component is reduced.

In the case where the semiconductor chip and the optical grating body are molded by potting resin with an air layer existing therebetween, the air layer is sealed. Thus, fogging is prevented.

As described above, the solid-state imaging device according to this invention is constructed to separate, by using the optical grating body, an incident light into rays of light having different wavelength distributions to allow them to be incident to the respective pixel trains. Accordingly, unlike the case where an approach is employed to absorb a light by using a color filter, etc. to carry out separation of light into spectral components, the total quantity of light can reach the pixel train. Thus, a high sensitivity color camera can be constituted by a simple optical system comparable to that of the monochromatic imaging device.

BRIEF DESCRIPTION OF THE DISCLOSURE

DETAILED DESCRIPTION OF THE PREFERRED EMBODIMENTS

Figure 1:
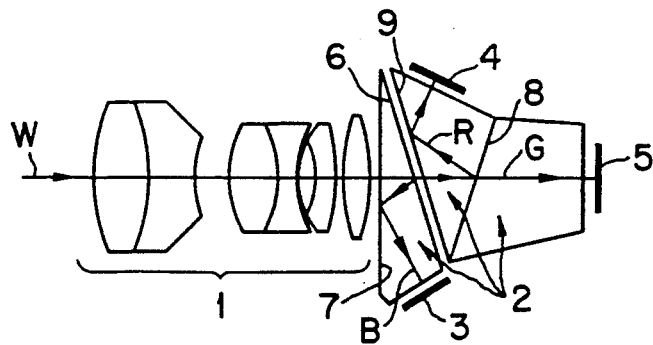
FIG. 1 is a longitudinal cross sectional view showing the structure of a color camera of the three imaging device type using conventional solid-state imaging devices.
Figure 2:
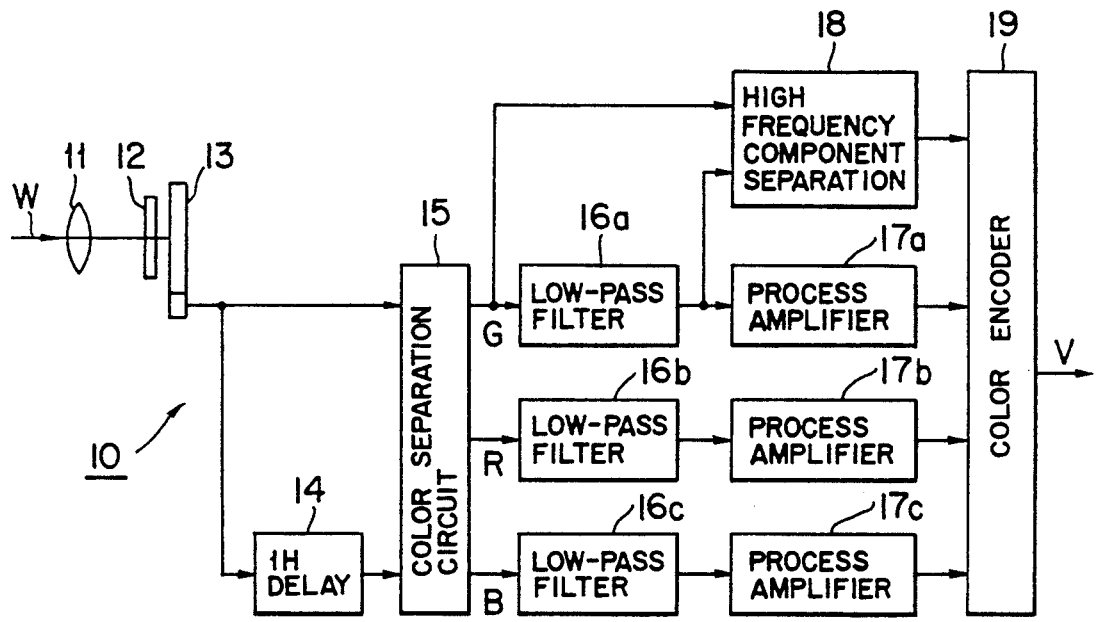
FIG. 2 is a block diagram showing the circuit configuration of a color camera of the single imaging device type using a conventional solid-state imaging device.
Figure 3:
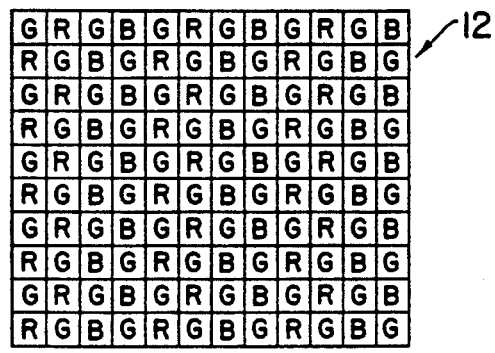
FIG. 3 is an arrangement view showing the configuration of a color filter used in the color camera shown in FIG. 2.
Figure 4:
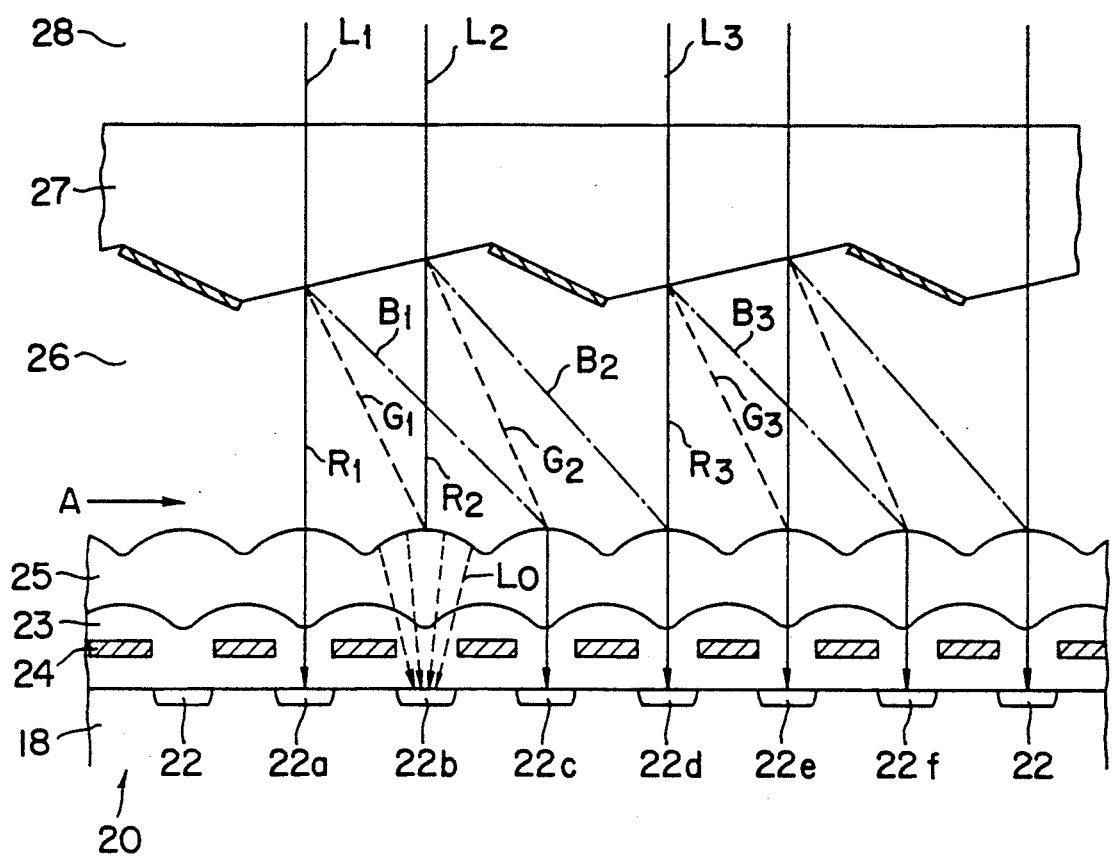
FIG. 4 is a longitudinal cross sectional view showing the structure of a solid-state imaging device according to an embodiment of this invention.
Figure 5:
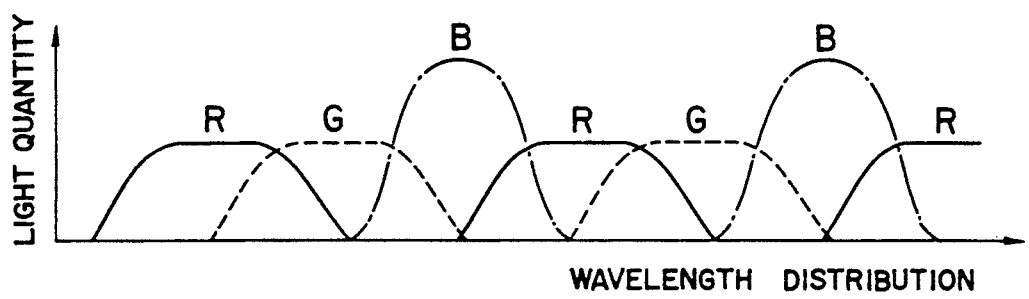
FIG. 5 is a characteristic diagram showing the wavelength distributions of rays of light separated by the optical grating body of the device shown in FIG. 4.

A preferred embodiment will now be described with reference to the attached drawings. FIG. 4 shows a longitudinal cross section of the structure of a solid-state imaging device according to this embodiment. This solid-state imaging device 20 is used for an ordinary television camera, has 300,000 pixels, and employs the interline transfer system. At the surface portion of a semiconductor substrate 18, a plurality of photo-diodes 22 are formed, and pixel trains are arranged in a first direction toward the direction perpendicular to the plane surface of paper. A protective film 23 is deposited by the Chemical Vapor Deposition (CVD) process on the surface of the semiconductor substrate 21. Within the protective film 23, light-shielding films 24 are provided for the purpose of light-shielding portions where no photo-diode 22 exists on the semiconductor substrate 18.

On the surface of the protective film 23, a micro-lens 25 comprised of a transparent organic material is formed. This micro-lens 25 is provided for converging a light incident to each photo-diode 22 as indicated by the dotted line Lo thus to increase a quantity of light, and is such that very small lens sections are contiguously formed for every respective pixel. The micro-lens itself is used as a portion of a color filter in a solid-state imaging device for a color camera of the single imaging device type already on the market However, the micro-lens of this embodiment is not a portion of the color filter, and does not carry out color separation.

On the side of the exposed surface of the micro-lens 25, an optical grating body 27 is provided through an air layer 26. This optical grating body 27 is comprised of transparent resin, and is such that optical gratings are provided with a pitch of three pixels. When a light Lo is incident from an air layer 28 to the optical grating body 27, it is separated into rays of light like a prism at every respective optical grating at the boundary between the optical grating body 27 and the air layer 26. Thus differing wavelength distributions are given to three pixels, respectively. These waveform distributions are such that respective rays of light are distributed in a manner that light quantities of red light R, green light G and blue light B increase in correspondence with the positions of pixels.

Here, the waveform distribution is determined by the cross sectional shape (profile) of the optical grating body 27, refraction factor between the transparent resin and air, the pixel pitch, and the distance between the optical grating body 27 and the micro-lens 25.

By employing such a structure, an incident light reaches each pixel as follows. An incident light $L_1$ is first separated into a red light $R_1$, a green light $G_1$ and a blue light $B_1$ by the optical grating body 27. Respective rays of light $R_1$, $G_1$ and $B_1$ thus separated are converged by the micro-lens 25, and are incident to photo-diodes 22a, 22b and 22c, respectively. Further, an incident light $L_2$ is separated into a red light $R_2$, a green light $G_2$ and a blue light $B_2$ by the optical grating body 27, and are incident to photo-diodes 22b, 22c and 22d, respectively. In addition, an incident light $L_3$ is separated into a red light $R_3$, a green light $G_3$ and a blue light $B_3$, and are incident to photo-diodes 22d, 22e and 22f, respectively. In this way, the green light $G_1$ the red light $R_2$ are incident to the photo-diode 22b, the blue light $B_1$ and the green light $G_2$ are incident to the photo-diode 22c, and the blue light $B_2$ and the red light $R_3$ are incident to the photo-diode 22d.

In the case of the conventional color camera of the single imaging device type, as described above, since an approach is employed to absorb an incident light by the color filter to carry out separation of light into spectral components, the quantity of light is reduced to one third, resulting in lowered sensitivity. On the contrary, in accordance with the solid-state imaging device of this embodiment, the same quantity of light as that of the camera of the three solid-state imaging device type is provided although a camera of the single imaging device type is employed. Thus, the sensitivity is improved to much degree.

Figure 6:
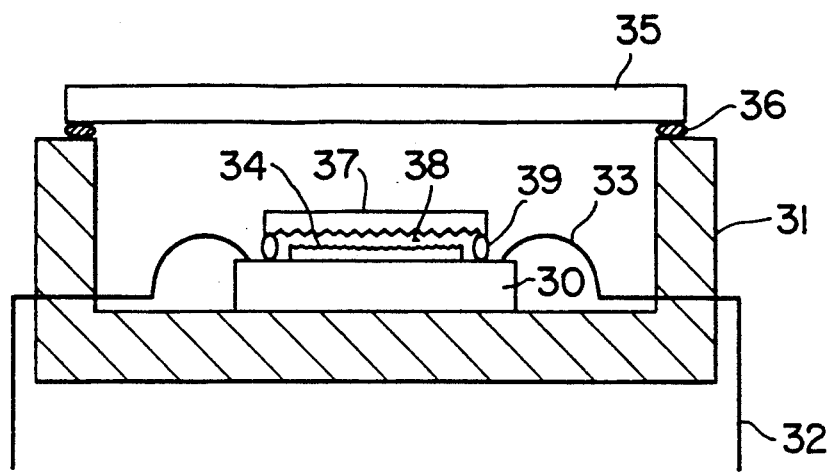
FIG. 6 is a longitudinal cross sectional view showing the structure of a hollow type package of the device shown in FIG. 4.

Further, the package structure of the solid-state imaging device of this embodiment is as simple as that of the conventional single imaging device type camera. The case where a hollow type package structure is used is first shown in FIG. 6. A semiconductor chip 30 is mounted on the inner bottom surface of a ceramic package 31 wherein aluminum electrode thereof and leads 32 are connected by way of bonding wires 33. On the surface of the semiconductor chip 30, a micro-lens 34 is provided. On the upper surface of the ceramic package 31, a glass window section 35 is bonded through seal resin 36.

In addition, on the surface of the semiconductor chip 30, an optical grating body 37 is bonded with an air layer existing therebetween. This bonding is carried out by painting a seal resin 39 at the peripheral portion of the surface of the semiconductor chip 30. To obtain a desired wavelength distribution by the optical grating body 37, the parallelism between the semiconductor chip 30 and the optical grating body 37 is important. Accuracy is ensured by the above-mentioned bonding.

Figure 7:
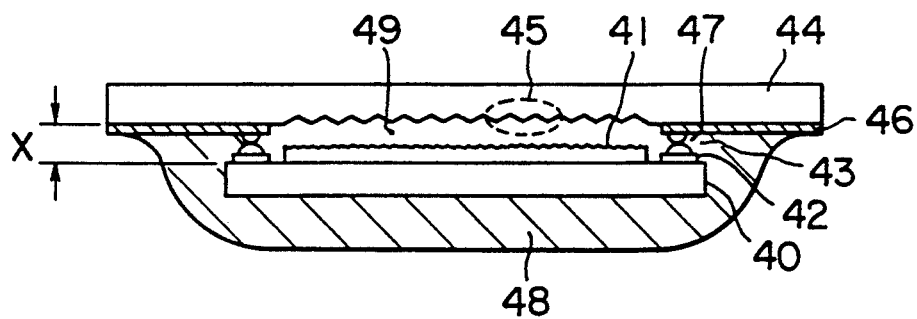
FIG. 7 is a longitudinal cross sectional view showing the package structure of the Face Down type of the device shown in FIG. 4.

The package structure shown in FIG. 7 is called a Face Down system. A micro-lens 41 is formed on the surface of a semiconductor chip 40, and gold bumps 43 are formed at peripheral aluminum electrode portions 42. On the upper portion of the semiconductor chip 40, a glass window section 44 where the optical grating body 45 is formed is bonded. At the peripheral portion except for the portion where the optical grating 45 of the glass window section 44 is formed, wiring portions 46 are formed. On the surfaces of respective wiring portions 46, solder bumps 47 are formed. These solder bumps 47 are connected to the gold bumps 43. With an air layer 49 existing between the semiconductor chip 40 and the optical grating 45, in a manner to cover the back side of the semiconductor chip 40, potting is carried out by resin 48.

In this case, the distance x between the optical grating 45 and the semiconductor chip 40 is automatically determined by the heights of the gold bump 43 and the solder bump 47 so that it is equal to about 30 um, and excellent parallelism can be provided. Further, when compared to the hollow type package structure, since the optical grating 45 is provided at the glass window section 44, the number of components to be assembled is reduced by one, so the number of process steps is reduced. This, the manufacturing cost can be reduced. In the case of the hollow type package structure, there is the possibility that a multiple reflection may take place between the glass window section 35 and the optical grating body 37, giving rise to flare. On the contrary, in the case of the Face Down type package structure, since the both members are integrally formed with each other, occurrence of such a flare is prevented. Further, since the air layer 49 is sealed by resin 48, occurrence of fogging is prevented even in the case where temperature changes. It should be noted that the hollow type package structure is more excellent from a view point of reliability of mechanical strength, etc. Accordingly, it is necessary to properly use both structures depending upon the intended use.

It is to be noted that the above-described embodiment is only one example, but does not limit this invention. While, e.g., the optical grating body shown in FIG. 4 is saw-tooth shaped in cross section, the shape of the optical grating body is not limited to such a shape. Namely, the optical grating body may take any shape capable of separating an incident light into rays of light having different wavelength distributions at a pitch two times or three times larger the pixel train. In addition, although provision of a micro-lens body increases the quantity of light, this member is not necessarily required.

What is claimed is:

1. A solid-state imaging device comprising:
   a semiconductor chip in which a plurality of pixels are arranged in a matrix form in a first direction and in a second direction perpendicular thereto on one surface of a semiconductor substrate, and said pixels in said first direction form a plurality of pixel trains; and
   an optical grating body including a plurality of optical gratings which are arranged at a pitch of two or three of the pixel trains in said second direction, having a fixed inclination relative to said substrate surface, and juxtaposed in said first direction, and wherein adjacent two gratings constantly have the same distance and constantly have said fixed inclination, to separate at each of said gratings, an incident light into rays of light of different wavelengths, thereby supplying the incident light to the pixel trains in said first direction.

2. The imaging device according to claim 1, wherein said optical grating body is provided with an air layer existing between said optical grating body and said semiconductor chip, a lens body for converging rays of light every pixel train to allow them to be incident thereto being provided on the surface of said semiconductor chip.

3. The imaging device according to claim 1, wherein said optical grating body is connected by metal in the form a of bump to a wiring portion of said semiconductor chip.

4. The imaging device according to claim 1, wherein said optical grating body is disposed in an optical window section of a package.

5. The imaging device according to claim 1, wherein said semiconductor chip and said optical grating body are molded by potting resin with an air layer existing therebetween.

6. A solid-state imaging device comprising:
a plurality of pixels arranged on a surface of a semiconductor substrate, said pixels being arranged in a matrix formed in a first direction and in a second direction perpendicular to said first direction, said pixels forming a plurality of pixel trains in said first direction; and
an optical grating body including a plurality of optical gratings, said optical gratings being arranged at a uniform pitch, said pitch being an integral number of pixels, and having a fixed inclination relative to said substrate surface, thereby separating incident light at each of said gratings into rays of light of different wavelengths and supplying incident light to said pixel trains with a predetermined wavelength distribution.

7. A solid-state imaging device according to claim 6 wherein said optical gratings are arranged in said second direction at a pitch of two of said pixel trains.

8. A solid-state imaging device according to claim 6 wherein said optical gratings are arranged in said second direction at a pitch of three of said pixel trains.

9. A solid-state imaging device according to claim 6 further comprising a plurality of micro-lenses disposed between said pixels and said diffraction gratings, one of said micro-lenses being provided for each of said pixels, each of said micro-lenses being arranged to converge light from a plurality of said diffraction gratings onto one of said pixels.

* * * * *